US 9,263,784 B2

(12) United States Patent
Inagaki et al.

(10) Patent No.: US 9,263,784 B2
(45) Date of Patent: Feb. 16, 2016

(54) PACKAGE SUBSTRATE

(71) Applicant: IBIDEN CO., LTD., Ogaki-shi (JP)

(72) Inventors: Yasushi Inagaki, Ogaki (JP); Yasuhiro Takahashi, Ogaki (JP); Satoshi Kurokawa, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/702,194

(22) Filed: May 1, 2015

(65) Prior Publication Data

US 2015/0318596 A1    Nov. 5, 2015

(30) Foreign Application Priority Data

May 2, 2014    (JP) ................................. 2014-095269

(51) Int. Cl.
*H05K 1/00* (2006.01)
*H01P 3/08* (2006.01)
(Continued)

(52) U.S. Cl.
CPC .............. *H01P 3/081* (2013.01); *H05K 1/0213* (2013.01); *H05K 1/111* (2013.01); *H05K 1/181* (2013.01); *H05K 2201/10159* (2013.01)

(58) Field of Classification Search
CPC ............. H05K 1/00; H05K 1/02; H05K 1/05; H05K 1/09; H05K 1/11; H05K 1/16; H05K 1/18; H05K 1/185; H05K 3/00; H05K 3/02; H05K 3/10; H05K 3/32; H05K 3/36; H05K 3/42; H05K 3/46; H05K 3/4697; H01L 21/20; H01L 21/48; H01L 21/4763; H01L 23/48; H01L 23/52; H01L 23/498; H01L 31/02

USPC ......... 174/250, 251, 255, 257, 258, 260–262, 174/264–266, 667; 257/448, 669, 690, 734, 257/774; 361/311, 728, 748, 761, 763, 767, 361/771, 782, 794; 428/212, 221
See application file for complete search history.

(56) References Cited

U.S. PATENT DOCUMENTS 6,930,258 B1 * 8/2005 Kawasaki ......... H01L 23/49811
174/255
8,111,954 B2 * 2/2012 Koizumi .................. G02B 6/43
385/129

(Continued)

FOREIGN PATENT DOCUMENTS

JP        06-053349 A    2/1994

*Primary Examiner* — Xiaoliang Chen
(74) *Attorney, Agent, or Firm* — Oblon, McClelland, Maier & Neustadt, L.L.P.

(57) ABSTRACT

A package substrate includes a core substrate, a first buildup layer and a second buildup layer. The first buildup layer includes an uppermost interlayer, an upper inner interlayer, an uppermost conductive layer including first pads and second pads, an upper first conductive layer, an upper second conductive layer, vias formed through the uppermost interlayer and connecting the upper first conductive layer and the second pads, and skip vias formed through the uppermost and upper inner interlayers and connecting the uppermost and upper second conductive layers. The second buildup layer includes a lowermost interlayer, a lower inner interlayer, a lowermost conductive layer including third pads, a lower first conductive layer, a lower second conductive layer, vias formed through the lowermost interlayer and connecting the lower first conductive layer and third pads, and skip vias formed through the lowermost and lower inner interlayers and connecting the lowermost and lower second conductive layers.

20 Claims, 12 Drawing Sheets

(51) Int. Cl.
　　　*H05K 1/11*　　　(2006.01)
　　　*H05K 1/18*　　　(2006.01)
　　　*H05K 1/02*　　　(2006.01)

(56) References Cited

U.S. PATENT DOCUMENTS

| | | | |
|---|---|---|---|
| 2002/0182958 A1* | 12/2002 | Tani | B32B 15/04 442/180 |
| 2004/0134682 A1* | 7/2004 | En | C23C 18/1607 174/258 |
| 2005/0057906 A1* | 3/2005 | Nakatani | H05K 3/321 361/771 |
| 2005/0190808 A1* | 9/2005 | Yonekura | G02B 6/43 372/50.1 |
| 2006/0046464 A1* | 3/2006 | Miura | H01L 23/49822 438/622 |
| 2006/0145328 A1* | 7/2006 | Hsu | H01L 23/5389 257/690 |
| 2007/0057375 A1* | 3/2007 | Nakamura | H01L 21/4857 257/758 |
| 2007/0230150 A1* | 10/2007 | Castriotta | H01L 23/49827 361/794 |
| 2007/0261234 A1* | 11/2007 | Song | H05K 3/381 29/829 |
| 2007/0263364 A1* | 11/2007 | Kawabe | H01L 23/49822 361/728 |
| 2008/0149384 A1* | 6/2008 | Kawabe | H10L 23/49822 174/265 |
| 2009/0094825 A1* | 4/2009 | Maehara | H05K 1/115 29/852 |
| 2009/0095509 A1* | 4/2009 | Hirano | H05K 1/115 174/250 |
| 2009/0095511 A1* | 4/2009 | Iida | H05K 3/38 174/255 |
| 2009/0095524 A1* | 4/2009 | Iida | H05K 3/4608 174/667 |
| 2009/0098391 A1* | 4/2009 | Nakagawa | H05K 1/036 428/433 |
| 2009/0229868 A1* | 9/2009 | Tsukada | H05K 3/4661 174/258 |
| 2010/0071940 A1* | 3/2010 | Ejiri | C23C 18/1651 174/257 |
| 2010/0084175 A1* | 4/2010 | Suzuki | H01L 21/4857 174/260 |
| 2010/0140782 A1* | 6/2010 | Kim | H01L 23/5383 257/690 |
| 2010/0163168 A1* | 7/2010 | Saita | H01L 21/4857 156/247 |
| 2010/0163172 A1* | 7/2010 | Saita | B32B 38/0008 156/272.6 |
| 2010/0300740 A1* | 12/2010 | Ichiyanagi | H01G 4/232 174/260 |
| 2010/0321914 A1* | 12/2010 | Inagaki | H01L 21/4857 361/783 |
| 2011/0232085 A1* | 9/2011 | Muramatsu | H05K 3/0032 29/852 |
| 2011/0284282 A1* | 11/2011 | Ishida | H05K 1/0251 174/266 |
| 2012/0067635 A1* | 3/2012 | Nang | B23K 1/0016 174/260 |
| 2012/0110839 A1* | 5/2012 | Nishio | H05K 3/465 29/830 |
| 2012/0153495 A1* | 6/2012 | Mallik | H01L 23/49827 257/774 |
| 2012/0212919 A1* | 8/2012 | Mano | H05K 1/185 361/782 |
| 2012/0312590 A1* | 12/2012 | Maeda | H05K 1/0269 174/261 |
| 2012/0314389 A1* | 12/2012 | Takenaka | H05K 1/165 361/761 |
| 2012/0328857 A1* | 12/2012 | Yajima | H05K 3/0097 428/212 |
| 2013/0020116 A1* | 1/2013 | Mano | H05K 1/0237 174/258 |
| 2013/0025782 A1* | 1/2013 | Higo | B32B 37/02 156/306.6 |
| 2013/0032485 A1* | 2/2013 | Muramatsu | C25D 5/48 205/125 |
| 2013/0048355 A1* | 2/2013 | Furuta | H05K 3/4602 174/257 |
| 2013/0074332 A1* | 3/2013 | Suzuki | H05K 1/185 29/834 |
| 2013/0192879 A1* | 8/2013 | Morita | H05K 3/4655 174/251 |
| 2013/0192884 A1* | 8/2013 | Furutani | H05K 1/185 174/258 |
| 2013/0221505 A1* | 8/2013 | Furutani | H01L 23/49838 257/669 |
| 2013/0221518 A1* | 8/2013 | Ishida | H05K 1/0298 257/737 |
| 2013/0223033 A1* | 8/2013 | Mano | H01F 17/0013 361/763 |
| 2013/0240258 A1* | 9/2013 | Ishida | H05K 1/0306 174/258 |
| 2013/0256007 A1* | 10/2013 | Furutani | H05K 1/185 174/255 |
| 2013/0285254 A1* | 10/2013 | Kainuma | H01L 24/18 257/774 |
| 2013/0342301 A1* | 12/2013 | Mano | H01F 27/2804 336/200 |
| 2014/0014399 A1* | 1/2014 | Kariya | H05K 1/02 174/250 |
| 2014/0027165 A1* | 1/2014 | Morita | H05K 1/0306 174/258 |
| 2014/0054068 A1* | 2/2014 | Kato | H05K 1/0284 174/251 |
| 2014/0083747 A1* | 3/2014 | Matsuno | H05K 1/0269 174/251 |
| 2014/0090877 A1* | 4/2014 | Takagi | H05K 3/02 174/255 |
| 2014/0091892 A1* | 4/2014 | Tominaga | H05K 1/165 336/200 |
| 2014/0116759 A1* | 5/2014 | Watanabe | H05K 1/0206 174/255 |
| 2014/0116762 A1* | 5/2014 | Oyoshi | H01L 23/145 174/258 |
| 2014/0118976 A1* | 5/2014 | Yoshikawa | H01L 23/49822 361/763 |
| 2014/0182897 A1* | 7/2014 | Lee | H05K 3/002 174/251 |
| 2014/0225701 A1* | 8/2014 | Morita | H01F 17/0013 336/200 |
| 2014/0268612 A1* | 9/2014 | Zhang | H01L 23/492 361/767 |
| 2014/0311772 A1* | 10/2014 | Mizutani | H05K 3/429 174/251 |
| 2014/0311780 A1* | 10/2014 | Shizuno | H05K 1/0269 174/258 |
| 2015/0208501 A1* | 7/2015 | Hayashi | G03F 7/20 174/251 |
| 2015/0216059 A1* | 7/2015 | Hayashi | H05K 3/3452 174/251 |

\* cited by examiner

PACKAGE SUBSTRATE

CROSS-REFERENCE TO RELATED APPLICATIONS

The present application is based upon and claims the benefit of priority to Japanese Patent Application No. 2014-095269, filed May 2, 2014, the entire contents of which are incorporated herein by reference.

BACKGROUND OF THE INVENTION

1. Field of the Invention

The present invention relates to a package substrate on which multiple electronic components is mounted.

2. Description of Background Art

Japanese Unexamined Patent Application Publication No. H06-53349 describes a multi-chip module substrate. Two large-scale integration (LSI) chips are mounted on a single substrate. The two LSI chips are connected via interconnect layers. The interconnect layers are drawn in different insulating layers. The entire contents of this publication are incorporated herein by reference.

SUMMARY OF THE INVENTION

According to one aspect of the present invention, a package substrate includes a core substrate, a first buildup layer formed on a first surface of the core substrate, and a second buildup layer formed on a second surface of the core substrate on the opposite side with respect to the first surface of the core substrate. The first buildup layer includes an uppermost insulating resin interlayer, an upper inner insulating resin interlayer, an uppermost conductive layer formed on the uppermost insulating resin interlayer and including first pads positioned to mount a first electronic component and second pads positioned to mount a second electronic component, an upper first conductive layer formed on the upper inner insulating resin interlayer, an upper second conductive layer formed on the upper inner insulating resin interlayer on the opposite side with respect to the upper first conductive layer, conductive vias formed through the uppermost insulating resin interlayer such that the conductive vias are connecting the upper first conductive layer and the second pads, and conductive skip vias formed through the uppermost insulating resin interlayer and the upper inner insulating resin interlayer such that the conductive skip vias are connecting the uppermost conductive layer and the upper second conductive layer. The second buildup layer includes a lowermost insulating resin interlayer, a lower inner insulating resin interlayer, a lowermost conductive layer formed on the lowermost insulating resin interlayer and including third pads, a lower first conductive layer formed on the lower inner insulating resin interlayer, a lower second conductive layer formed on the lower inner insulating resin interlayer on the opposite side with respect to the lower first conductive layer, conductive vias formed through the lowermost insulating resin interlayer such that the conductive vias are connecting the lower first conductive layer and the third pads, and conductive skip vias formed through the lowermost insulating resin interlayer and the lower inner insulating resin interlayer such that the conductive skip vias are connecting the lowermost conductive layer and the lower second conductive layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
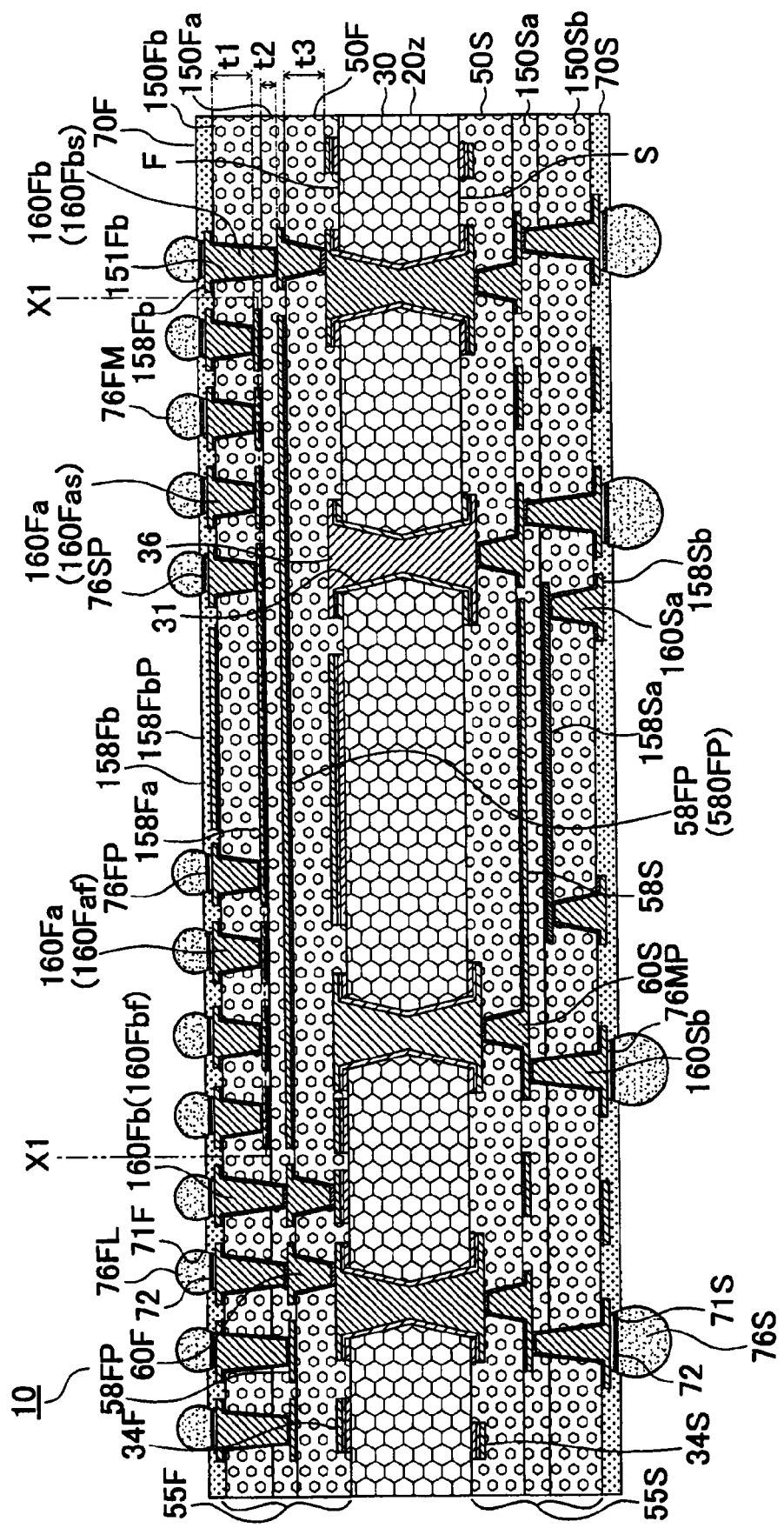
FIG. 1 is a cross-sectional view illustrating a package substrate according to a first embodiment of the invention.

The embodiments will now be described with reference to the accompanying drawings, wherein like reference numerals designate corresponding or identical elements throughout the various drawings.

First Embodiment

Figure 10A:
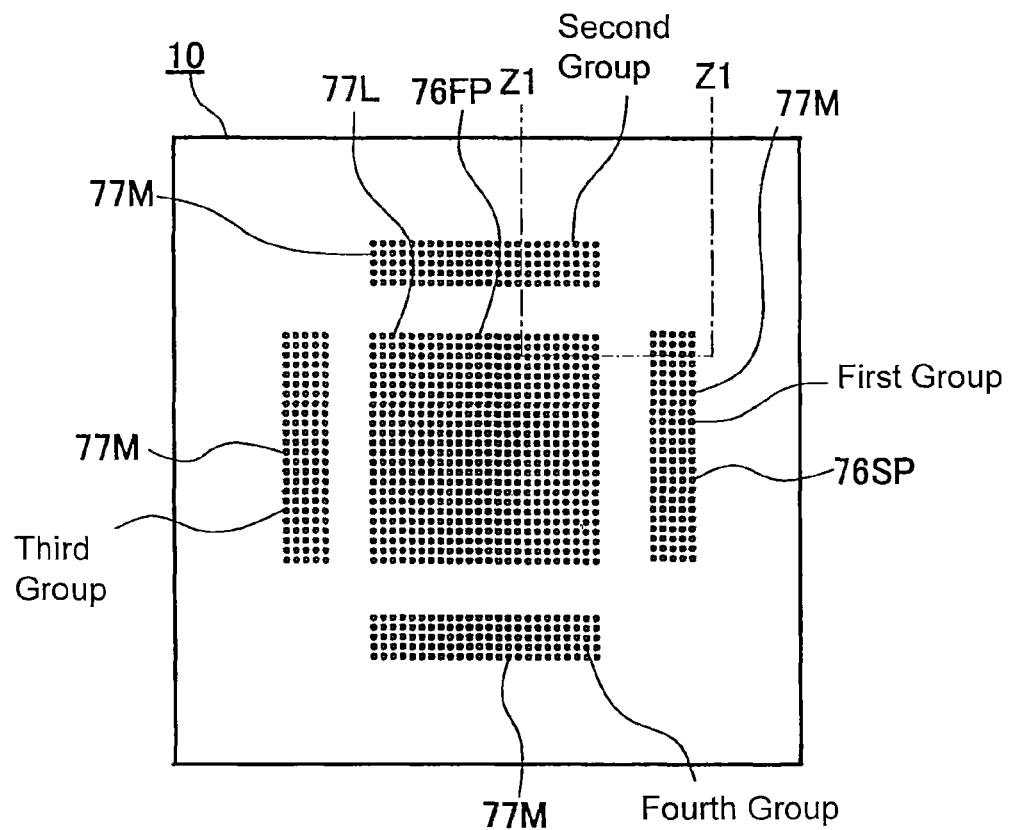
FIG. 10A is a plan view illustrating pad groups.
Figure 10B:
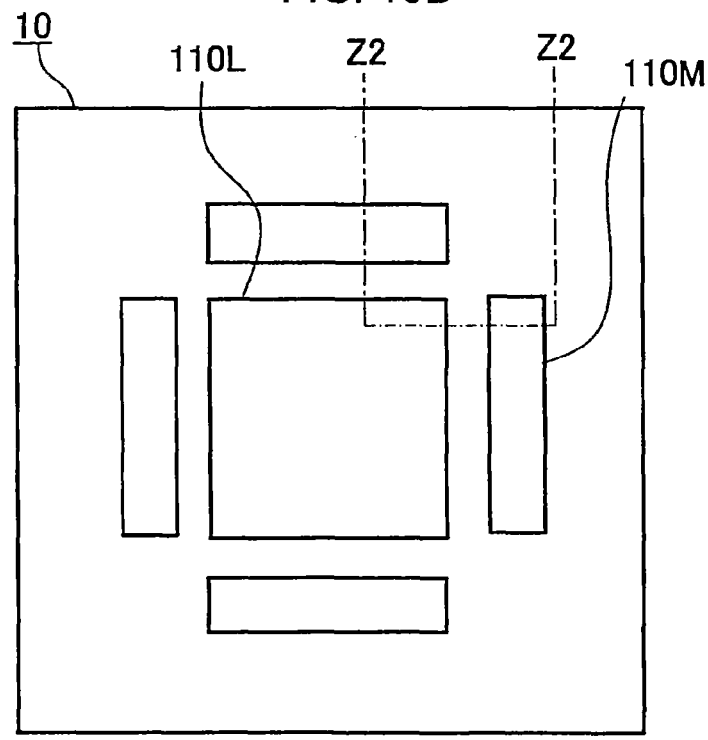
FIG. 10B is a plan view exemplifying an application thereof.

FIG. 10A illustrates the mounting surface of a package substrate according to a first embodiment of the invention. FIG. 10B is a plan view exemplifying an application of the first embodiment where electronic components are mounted on the package substrate. As illustrated in FIG. 10A, a mounting area (77L) is formed at the center of the mounting surface of the package substrate for installing a first electronic component such as logic ICs and the like. A grid of first pads (76FP) is formed on the mounting area (77L) whereon the first electronic component may be mounted. The first pads (76FP) form a first pad group. Solder bumps are formed on the first pads for mounting the first electronic component. A mounting area (77M) is formed outside the mounting area (77L) for mounting a second electronic component such as memory. In FIG. 10A, the mounting area (77M) is formed at four locations surrounding the mounting area (77L). A grid of second pads (76SP) is formed on the mounting area (77M) whereon the second electronic component may be mounted. The second pads form a second pad group. Solder bumps are formed on the second pads for mounting the second electronic component. In FIG. 10B, a logic IC (110L) is mounted on the solder bumps in the mounting area (77L), and a memory (110M) is mounted on the solder bumps in the mounting area (77M).

Figure 2:
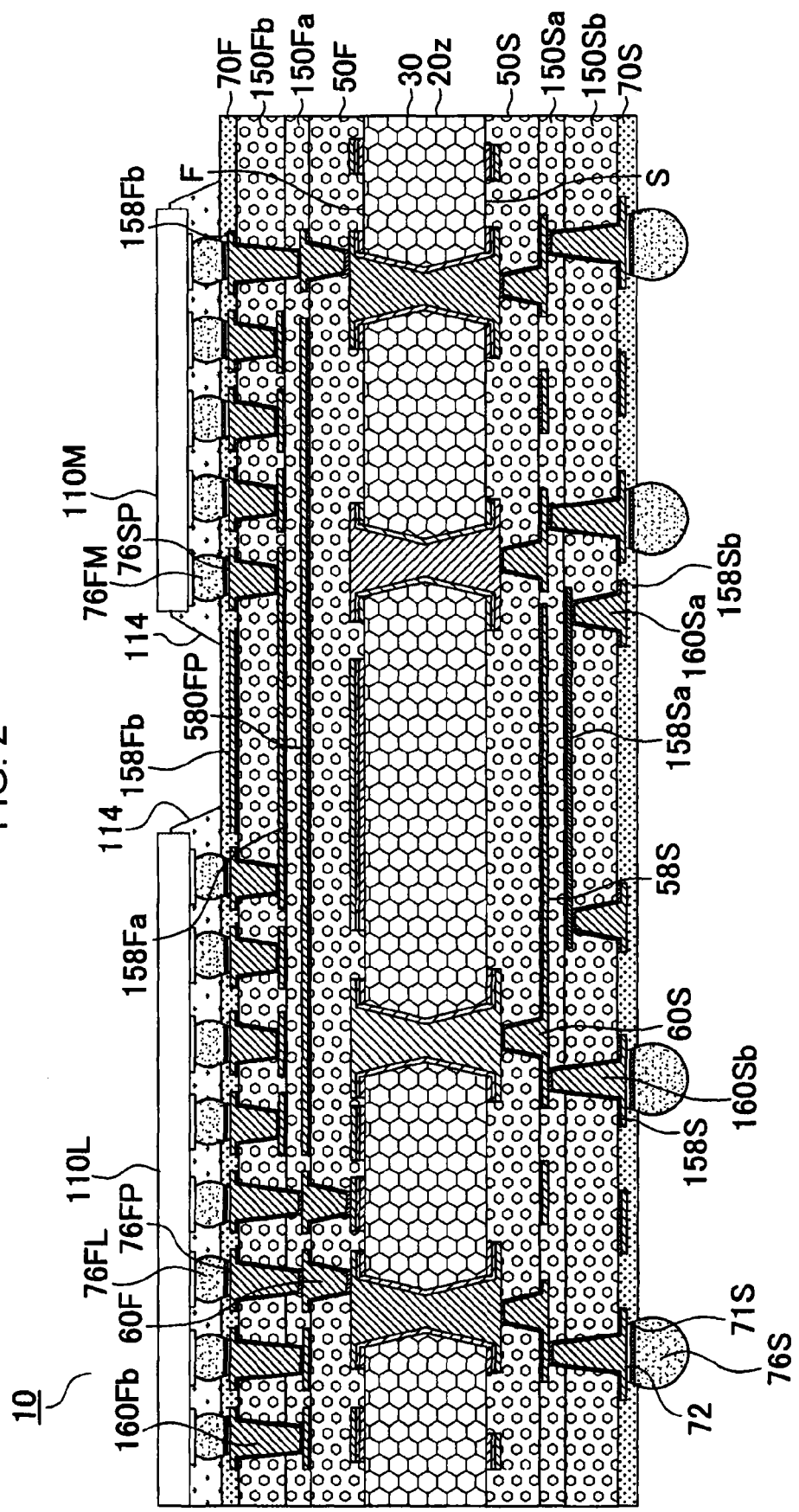
FIG. 2 is a cross-sectional view exemplifying an example of a package substrate according to the first embodiment.

FIG. 1 illustrates a cross-section of the package substrate according to an embodiment between the lines Z1-Z1 depicted in FIG. 10A. FIG. 2 illustrates a cross-section of the package substrate according to an embodiment between the lines Z2-Z2 depicted in FIG. 10B. Solder bumps (76FL) are formed on the first pads (76FP) for mounting the first electronic component (110L). Solder bumps (76FM) are formed on the second pads (76SP) for mounting the second electronic component (110M).

As illustrated in FIG. 1, the package substrate according to the first embodiment includes an uppermost conductive layer (158Fb), which includes pads for mounting electronic components. Moreover, the package substrate includes an uppermost insulating resin interlayer (150Fb) that supports the uppermost conductive layer (158Fb).

First conductive vias (160Faf) and second conductive vias (160F) as are formed on the uppermost insulating resin interlayer (150Fb). The first conductive vias (160Faf) and the second conductive vias (160Fas) connect to the first pads (76FP) and the second pads (76SP) respectively. The first conductive vias are preferably formed directly underneath the first pads. The second conductive vias are preferably formed directly underneath the second pads. A first upper conductive layer (158Fa) including first conductive circuits is formed underneath the uppermost insulating resin interlayer (150Fb). A first pad and a second pad are connected via a first conductive circuit. That is, the transmission of signals and the like between the first electronic component and the second electronic component occurs via the first conductive layer. All the first conductive circuits connect the first pads and the second pads. All the conductive circuits formed on the same surface as the first conductive circuits are included in the first conductive layer. The first upper conductive layer is a dedicated interconnect layer specifically for executing transmissions of signals between the first electronic component and the second electronic component. The first upper conductive layer does not include any other conductive circuits besides the conductive circuits (signal lines) used for carrying out transmissions of signals between the first electronic component and the second electronic component. The first upper conductive layer is a dedicated interconnect layer specifically for executing transmissions of signals between the first electronic component and the second electronic component.

Generally one bit of data is transmitted along a single signal line (a single first conductive circuit). Additionally the commands and data used in electronic devices such as personal computers and the like are structured from one byte (eight bits). When the weights and the thickness of each signal line differ, the electronic properties such as transmission speeds and the like differ between signal lines. Therefore it can be inferred that there will be a difference in the transmission times in the byte-by-byte transmission of signals. In that case, predictably, the signal may not be properly processed or the processing time may increase. The transmission time may also differ between the bits within one byte. Variations in the width and the thickness of the signal lines also mean that conceivably there is a signal line with a slower transmission time. Thus, the processing time may decrease because of that signal line.

The first embodiment includes a dedicated interconnect layer. Therefore, when forming the conductive layer (dedicated interconnect layer) that includes the signal lines, the manufacturing conditions and the like are tailored to the width and thickness of the signal lines. Consequently, in the first embodiment this reduces the variation in the widths and thicknesses of the signal lines. Thus the transmission speed of each of the signal lines is substantially identical. The signals traveling through the signal lines can be properly processed. Furthermore, the processing time does not increase even with a large amount of information. Multiple dedicated interconnect layers may be formed in the package substrate according to the first embodiment in accordance with the functions of the electronic components. However, when multiple dedicated interconnect layers is formed, a greater difference between the thicknesses and the widths of the signal lines can be expected. Therefore, to reduce the amount of variation in transmission times between the electronic components, the dedicated interconnect layer is preferably formed as a single layer. The dedicated interconnect layer may be formed in a different layer, so long as each of the layers includes interconnects used only for data transmission; thus there is only a small difference in transmission times. A single conductive layer may include all the conductive circuits and be sandwiched between two insulating resin interlayers, provided that, for example, the conductive circuit does not include circuits that do not transmit signals or power such as dummy conductors.

An inner insulating resin interlayer (150Fa) is formed underneath the uppermost insulating resin interlayer, and the first upper conductive layer (dedicated interconnect layer). The inner insulating resin interlayer supports the uppermost insulating resin interlayer, and the first conductive layer (dedicated interconnect layer). In FIG. 1, all the conductive circuits sandwiched between the inner insulating resin interlayer and the uppermost insulating resin interlayer are first conductive circuits. The uppermost insulating resin interlayer is preferably formed directly on the dedicated interconnect layer and the inner insulating resin interlayer. This shortens the distance between the electronic components and the dedicated interconnect layer.

A second conductive layer (58FP) including second conductive circuits is formed underneath the inner insulating resin interlayer (150Fa). Power is supplied to the electronic components through the second conductive layer. Therefore, the first pads and second pads include pads that are connected with the second conductive layer. The second conductive layer and the pads connected to the second conductive layer are connected through a conductive skip via (160Fb). The conductive skip via (160Fb) passes through both the uppermost insulating resin interlayer (150Fb) and the inner insulating resin interlayer (150Fa); this forms an opening (151Fb) for the conductive via up to the second conductive layer (58FP). The conductive skip via (160Fb) passes through both the uppermost insulating resin interlayer, and the inner insulating resin interlayer.

Given that the first conductive layer (158Fa) is a dedicated interconnect layer, no other conductive vias pass through the inner insulating resin interlayer besides the conductive skip via. The package substrate according to the first embodiment does not include any conductive vias that only pass through the inner insulating resin interlayer. Therefore, this increases the area whereon the first conductive circuits may be formed in the first conductive layer. Most of the first conductive circuits are formed in the first conductive layer. Thus, high-performance electronic components may be mounted to the package substrate according to the first embodiment. The dedicated interconnect layer may also be formed as a single layer. Thus, higher data transmission speeds become possible.

The conductive circuits in the dedicated interconnect layer (first conductive layer) are thinner than those in the uppermost conductive layer and the second conductive layer. The thickness of the uppermost conductive layer and the second conductive layer are substantially identical. For instance, the first conductive layer may be no more than one-half the thickness of the uppermost conductive layer and has a thickness of no more than 3 μm. The first conductive layer may be roughly 5 μm thick, while the uppermost conductive layer and the second conductive layer are roughly 10 μm thick. Thus, a fine conductive circuit may be formed on the dedicated interconnect layer. Further high-performance electronic components may be mounted on the package substrate.

The first conductive circuit is narrower than a conductive circuit included in the uppermost conductive layer or the second conductive layer. Here, the width of a conductive circuit is the width of the narrowest conductive circuit within the conductive layers. The first conductive circuit is one-half to two-thirds the width of a conductive circuit included in the uppermost conductive layer or the second conductive layer. For instance, the first conductive circuit may be roughly 5 μm wide, while the uppermost conductive layer and the second conductive layer are roughly 9 μm wide. The conductive circuit is cut along the surface perpendicular to the extending direction of the conductive circuit. Further, the width of the conductive circuit is the smallest distance that is less than the distance between opposing sidewalls.

The distance (width) of the space between adjacent first conductive circuits is narrower than the distance of the space between adjacent second conductive circuits. The distance of the space between adjacent first conductive circuits is one-half to two-thirds the distance of the space between adjacent second conductive circuits. For instance, the distance of the space between adjacent first conductive circuits is 5 μm, while the distance of the space between adjacent second conductive circuits is 12 μm. Here, the distance of the space is the narrowest distance of the space within the conductive layers. The distance of the space and the distance between adjacent conductive circuits is the same. The signal lines are preferably striplines, or microstrips. When the signal lines are striplines, the signal lines are sandwiched between the uppermost conductive layer and the second conductive layer.

The package substrate according to the first embodiment includes conductive vias formed on the dedicated interconnect layer, the uppermost insulating resin interlayer formed on the dedicated interconnect layer, and the uppermost insulating resin interlayer. These conductive vias connect the pads passing through both the uppermost conductive layer including multiple pads for mounting an electronic component, and the uppermost insulating resin interlayer with the dedicated interconnect layer. The pads include first pads for mounting a first electronic component, and second pads for mounting a second electronic component. Furthermore, the first pads include a first pad connected to the dedicated interconnect layer, and a first pad connected to a conductive layer besides the dedicated interconnect layer. The second pads also include a second pad connected to the dedicated interconnect layer, and a second pad connected to a conductive layer besides the dedicated interconnect layer. The pads connected to conductive layers other than the dedicated interconnect layer are connected to conductive skip vias. The first pads connected to the dedicated interconnect layer, and the second pads connected to the dedicated interconnect layer and to the signals lines inside the dedicated interconnect layer form a closed circuit. The package substrate according to the first embodiment may also include conductive skip vias that pass through the second conductive layer, the inner insulating resin interlayer formed on the second conductive layer, the uppermost insulating resin interlayer, and the inner insulating resin interlayer. The dedicated interconnect layer is formed on the inner insulating resin interlayer. The dedicated interconnect layer is preferably sandwiched between the uppermost insulating resin interlayer and the inner insulating resin interlayer.

The package substrate according to the first embodiment may also include a core substrate provided with a conductive layer. In that case, the inner insulating resin interlayer is formed on the core substrate and the conductive layer on the core substrate corresponds to the second conductive layer. Moreover, the package substrate according to the first embodiment may include a buildup layer between the core substrate and the inner insulating resin interlayer. Thus, the conductive layer (58FP) sandwiched between the insulating resin interlayer (50F) on the core substrate and the inner insulating resin interlayer (150Fa) is the second conductive layer. The buildup layer includes the insulating resin interlayer and the conductive layer where the insulating resin interlayer and the conductive layer are alternately laminated. A package substrate including a core substrate and a method of manufacturing the same are described in for example JP 2007-227512 A. The entire contents of this publication are incorporated herein by reference. The package substrate according to the first embodiment may include a coreless substrate. The coreless substrate includes the insulating resin interlayer and the conductive layer where the insulating resin interlayer and the conductive layer are alternately laminated. A coreless substrate and a method of manufacturing the same are described in, for example, JP 2005-236244 A. At least one of the conductive layers is the dedicated interconnect layer. The thickness of each of the insulating resin interlayers in the coreless substrate is 30 μm to 60 m.

The package substrate 10 illustrated in FIG. 1 has an identical core substrate 30 as described in JP 2007-227512 A. The core substrate 30 includes an insulating substrate (20z) that includes a first surface (upper part: F), and a second surface (lower part: S) opposite the first surface. The first surface (F) and the second surface (S) are also identical in the package substrate. A conductive layer (34F) is formed on the first surface (F) of the insulating substrate (20z), and a conductive layer (34S) is formed on the second surface (S). The insulating substrate 20z includes through holes 31. A conductive through hole 36 is formed inside the through holes 31 for connecting the conductive layer (34F) and the conductive layer (34S). The conductive through holes 31 are an hourglass shape similar to the shape exemplified in JP 2007-227512 A.

A first buildup layer (55F) is formed on the first surface (F) of the core substrate 30. The first surface of the core substrate and the first surface of the insulating substrate are the same surface. The first buildup layer (55F) includes the insulating resin interlayer (50F) (insulating resin interlayer on the first surface) formed on the core substrate 30, and the second conductive layer (58FP) formed on the insulating resin interlayer (50F). The first buildup layer (55F) also includes a conductive via (60F) that passes through the insulating resin interlayer (50F) and connects the second conductive layer (58FP) and the conductive layer (34F).

The first buildup layer (55F) further includes the inner insulating resin interlayer (150Fa) formed on the insulating resin interlayer (50F) and the second conductive layer (58FP), and a first conductive layer (158Fa) (first upper conductive layer) formed on the inner insulating resin interlayer (150Fa). The first conductive layer is the dedicated interconnect layer. There is no conductive via that passes through only the inner insulating resin interlayer (150Fa). The first buildup layer further includes the uppermost insulating resin interlayer (150Fb) (uppermost insulating resin interlayer) formed on the inner insulating resin interlayer (150Fa) and the first conductive layer (158Fa); the uppermost conductive layer (158Fb) (uppermost conductive layer) formed on the uppermost insulating resin interlayer (150Fb); the conductive via (160Fa) (uppermost conductive via) passing through the uppermost insulating resin interlayer and connecting the uppermost conductive layer and the first conductive layer; and the conductive skip via (160Fb) passing through the uppermost insulating resin interlayer and the inner insulating resin interlayer, and connecting the uppermost conductive layer and the second conductive layer. The uppermost conductive layer includes first pads (76FP) for mounting a first electronic component, and second pads (76SP) for mounting the second electronic component. The uppermost conductive via includes a first conductive via (160Faf) (uppermost first conductive via) connecting the first pads and the first conductive layer, and a second conductive via (160Fas) (uppermost second conductive via) connecting the second pads and the first conductive layer. The conductive skip via includes a first conductive skip via (160Fbf) connecting the first pads and the second conductive layer, and a second conductive skip via (160Fbs) connecting the second pads and the second conductive layer. When dedicated interconnect layers are formed, the dedicated interconnect layer is preferably formed in only the first buildup layer.

A second buildup layer (55S) is formed on the second surface (S) of the core substrate 30. The second buildup layer (55S) includes the insulating resin interlayer (50S) (insulating resin interlayer on the second surface) formed on the core substrate 30, and a second conductive layer (58S) formed on the insulating resin interlayer (50S). The second buildup layer (55S) also includes a conductive via (60S) that passes through the insulating resin interlayer (50S) and connects the second conductive layer (58S) and the conductive layer (34S).

The second buildup layer (55S) further includes the inner insulating resin interlayer (150Sa) formed on the insulating resin interlayer (50S) and the second conductive layer (58S), and a first conductive layer (158Sa) (first lower conductive layer) formed on the inner insulating resin interlayer (1505a). The first conductive layer is a grounding layer. There is no conductive via that passes through only the inner insulating resin interlayer (150Sa). The second buildup layer further includes the lowermost insulating resin interlayer (150Sb) (outermost insulating resin interlayer on the second surface) formed on the inner insulating resin interlayer (150Sa) and the first conductive layer (158Sa); the lowermost conductive layer (158Sb) (outermost conductive layer on the second surface) formed on the lowermost insulating resin interlayer (150Sb); the conductive via (160Sa) (third conductive via) passing through the lowermost insulating resin interlayer and connecting the uppermost conductive layer and the first conductive layer; and the conductive skip via (160Sb) passing through the lowermost insulating resin interlayer and the inner insulating resin interlayer, and connecting the lowermost conductive layer (158Sb) and the second conductive layer (58S). The first lower conductive layer (158Sa) is formed on the second surface at a location corresponding to the location of the first upper conductive layer (158Fa). The first buildup layer and the second buildup layer are formed symmetrically to sandwich the core substrate.

The first upper conductive layer (158Fa) used for signal transmissions between the first electronic component and the second electronic component is provided underneath the uppermost insulating resin interlayer (150Fb) while the first lower conductive layer (158Sa) is provided underneath the lowermost insulating resin interlayer (150Sb) in the package substrate according to the first embodiment. Therefore, it is possible to balance the percentage of remnant copper (area of the conductive circuit) on both the front and rear of the package substrate, so the package substrate tends not to warp. Additionally, the first lower conductive layer (158Sa) is used as a grounding layer, and noise can be suppressed.

A solder resist layer (70F) including an opening (71F) and a solder resist layer (70S) including an opening (71S) are formed on the first buildup layer (55F) and the second buildup layer (55S) respectively. The opening (71F) in the solder resist layer (70F) on the first buildup layer (55F) exposes the first pads (76FP) and the second pads (76SP). Solder bumps (76FL) (first solder bumps) and solder bumps (76FM) (second solder bumps) are formed on the first pads and the second pads respectively. Preferably the melting point of the first solder bumps and the second solder bumps are different. The mounting yield rate and connection reliability thus increases. This also facilitates switching out the electronic components. Solder bumps (76S) (third solder bumps) are formed on the second buildup layer (55S) on the pads (76MP) exposed by the opening (71S) in the solder resist layer (70S) for connecting a motherboard. A metallic layer, such as nickel-gold finish, or nickel-palladium-gold finish is formed on the pads (76FP, 76SP, 76MP). As illustrated in FIG. 2 and FIG. 10B, the IC chip (110L) is mounted on the IC-chip mounting solder bumps (76FL), and the memory (110M) is mounted on the memory-mounting solder bumps (76FM). The package substrate is mounted to the motherboard via the solder bumps (76S) formed on the second buildup layer (55S). Preferably, the melting point of the first solder bumps, the second solder bumps, and the third solder bumps are each are different. The mounting yield rate and connection reliability thereby increases.

Figure 11:
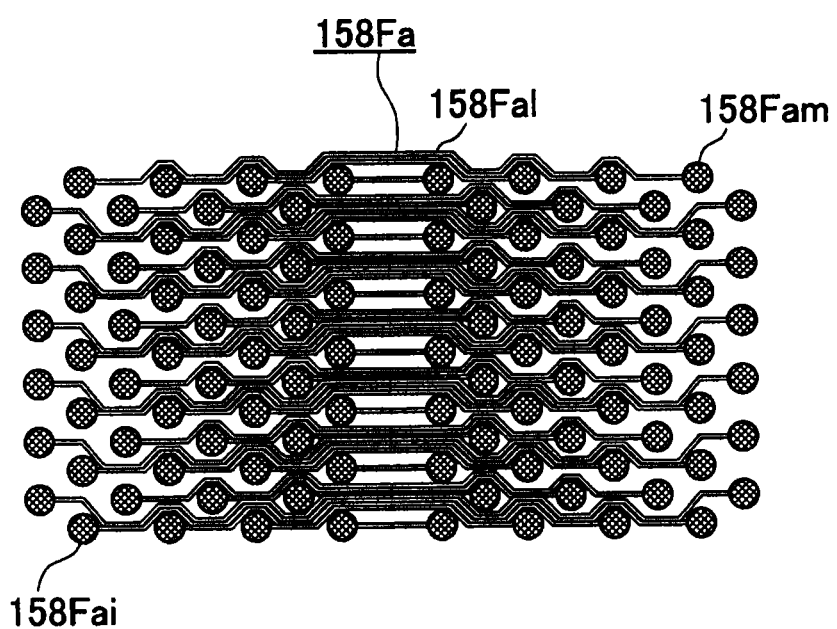
FIG. 11 is a plan view of a first conductive layer.

FIG. 11 is a plan view illustrating a portion of the dedicated interconnect layer (158Fa) (first upper conductive layer). The conductive elements depicted as circles in FIG. 11 are pads. The pads drawn on the left side are first conductive via pads (158Fai), and the pads drawn on the right side are second conductive via pads (158Fam). The first conductive vias (160Faf) are formed in the first conductive via pads, and the second conductive vias (160Fas) are formed in the second conductive via pads. The first conductive circuit includes interconnect wiring (158Fal) that connects a first conductive via pad (158Fai) and a second conductive via pad (158Fam), and a first conductive via pad (158Fai) and a second conductive via pad (158Fam). In the package substrate according to the first embodiment, all data transmission between the first electronic component such as a logic chip, and the second electronic component such as a memory chip are carried out via the first conductive layer.

The interconnect density increases in the first conductive layer (158Fa) in the package substrate according to the first embodiment; therefore, the interconnects are formed at a finer pitch than in the conductive layers on other layers. Thus, the interconnects are thin (for instance, roughly 3 to 11 µm, with an optimal value of 5 µm), and narrow (for instance, roughly 3 to 11 µm, with an optimal value of 5 µm). The area of the conductive circuit on the first conductive layer on the upper surface is 3% to 15% the area of the inner insulating resin interlayer (the area of the package substrate). Here, given that there are large variations in plating thickness at under 3%, the interconnects tend break at areas where the interconnects are too thin, thereby making difficult to obtain connection reliability. In contrast, when the size of the conductive circuit is greater than 15%, the volumes of the conductive circuits in the package substrate are different and unbalanced. That is, a greater volume of copper is layered onto the upper part than the volume of copper layered on the lower part, making the upper part more rigid than the lower part, and thus encouraging warping of the package substrate due to heat stress. Therefore, establishing the conductive circuit at a size of 3% to 15% reduces the warping effect and allows for increased connection reliability.

The first conductive circuit (158Fa) is sandwiched between a plain layer (158FbP) included in the uppermost conductive layer and a plain layer (580FP) included in the second conductive layer, forming a stripline. This improves the transmission properties of the first conductive circuit (158Fa).

The thickness of the inner insulating resin interlayer, and the thickness of other insulating resin interlayers are different. The insulating resin interlayers besides the inner insulating resin interlayer have equal thickness. The thickness of the insulating resin interlayers is equivalent to the distance between adjacent conductive layers. In FIG. 1, the thickness (t1) of the uppermost insulating resin interlayer (150Fb) is equivalent to the thickness (t3) of the insulating resin interlayer (50F) on the first surface. The thickness (t1, t3) of the insulating resin interlayers besides the inner insulating resin interlayer is from 5 μm to 40 μm. The thickness (t2) of the inner insulating resin interlayer is 5 μm to 20 μm. The thickness (t2) of the inner insulating resin interlayer is one-half to one-third the thickness (t1, t3) of other insulating resin interlayers. A fine conductive skip via is formed. The conductive skip via tends not to reduce the size of the formation area for the first conductive layer. Thus the package substrate is small. For example, when the thickness (t2) of the inner insulating resin interlayer (150Fa) is 13 μm, the thickness of the insulating resin interlayers besides the inner insulating resin interlayer is 35 μm.

The dedicated interconnect layer is formed directly beneath the uppermost insulating resin interlayer (150Fb), thus shortening the interconnect distance between the electronic components in the package substrate according to the first embodiment. This allows for higher signal transmission speeds between the electronic components. Further, each of the signal lines have approximately the same electrical properties because the package substrate according to the first embodiment includes the dedicated interconnect layer. Thus, the transmission times for byte-by-byte transmission of signals can be uniform. Signals may be appropriately transmitted even with faster transmission speeds. The processing time does not increase even with a large amount of information. The package substrate according to the first embodiment does not include any conductive vias that only pass through the inner insulating resin interlayer. Conductive skip vias passing through the inner insulating resin interlayer and the insulating resin interlayer on the inner insulating resin interlayer are also included in the package substrate according to the first embodiment. Thus the package substrate is small. Moreover, the transmission times for byte-by-byte transmission of signals can be uniform. Signals may be appropriately transmitted even with faster transmission speeds. The processing time does not increase even with a large amount of information.

Method of Manufacturing the Package Substrate According to the First Embodiment

FIG. 3A through 9C depict a method of manufacturing a package substrate according to the first embodiment.

Figure 3A:
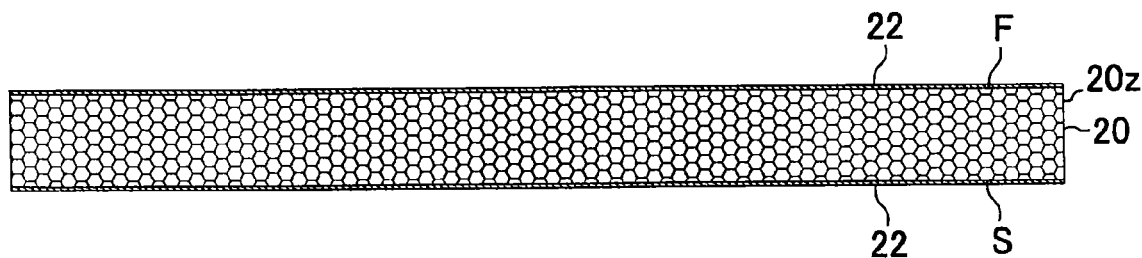
FIG. 3A through 3C are process diagrams illustrating a method of manufacturing the package substrate according to the first embodiment.

(1) A starting substrate 20 is prepared. The starting substrate includes a first surface (F) and a second surface (S) opposite the first surface. The starting substrate is preferably a dual-surface copper-clad laminated sheet. The dual-surface copper-clad laminated sheet is composed of an insulating substrate (20z) including the first surface (F) and the second surface (S) opposite the first surface, and metallic foils (22, 22) laminated onto both surfaces (FIG. 3A). The starting substrate in the first embodiment is the dual-surface copper-clad laminated sheet. The surface of the copper foils 22 is black-treated.

The insulating substrate (20z) is formed from resin and reinforcing material. The reinforcing material may be, for example, glass fiber cloth, aramid fiber, glass fiber, or the like. The resin may be, for example, epoxy resin, bismaleimide-triazine (BT) resin, or the like.

Figure 3B:
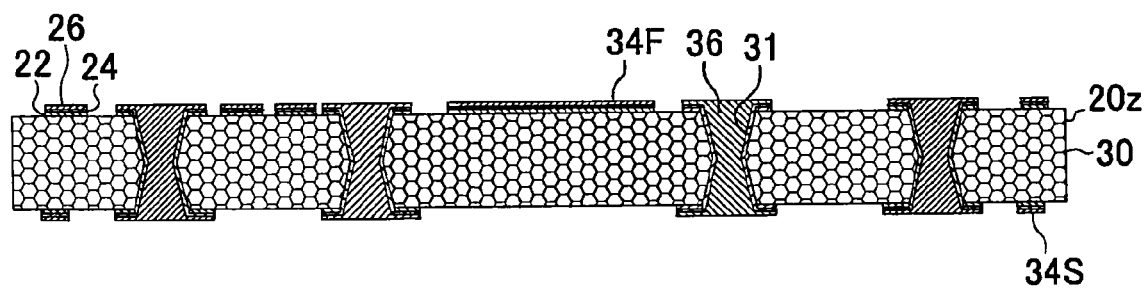
Figure 3C:
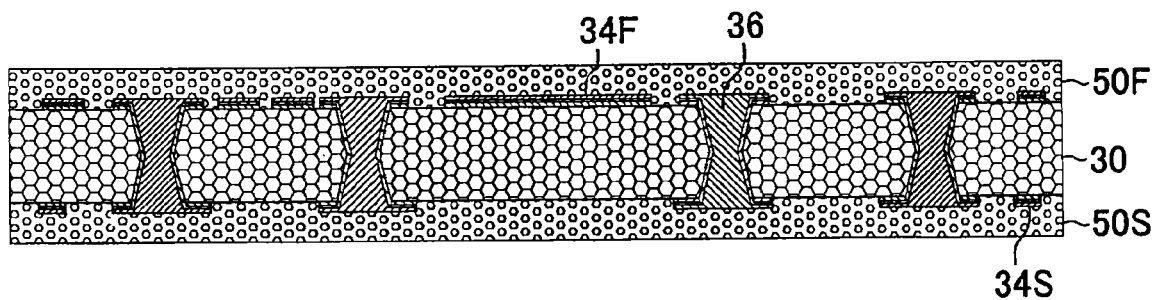

(2) The dual-surface copper-clad laminated sheet is processed to create a core substrate 30 provided with a conductive layer (34F) on the first surface, and a conductive layer (34S) on the second surface; a conductive through hole 36 is formed inside the through hole 31. The conductive layers are made from the metallic foil 22, an electroless plating 24, and an electroplated film 26 (FIG. 3B). The first surface and second surface of the core substrate 30 are respectively the same surfaces as the first surface and the second surface on the insulating substrate (20z). The core substrate 30 may be manufactured using the method described in U.S. Pat. No. 7,786,390 for example. The entire contents of this publication are incorporated herein by reference.

(3) The insulating resin interlayer (50F) on the first surface is formed on the first surface (F) of the core substrate 30. The insulating resin interlayer (50S) on the second surface is formed on the second surface (S) of the core substrate 30. The insulating resin interlayer may be made from inorganic particles such as silica, and a thermosetting resin such as epoxy. The insulating resin interlayer may further contain reinforcing material such as a glass fiber cloth. The thickness of the insulating resin interlayers (50F, 50S) is roughly 35 μm.

Figure 4A:
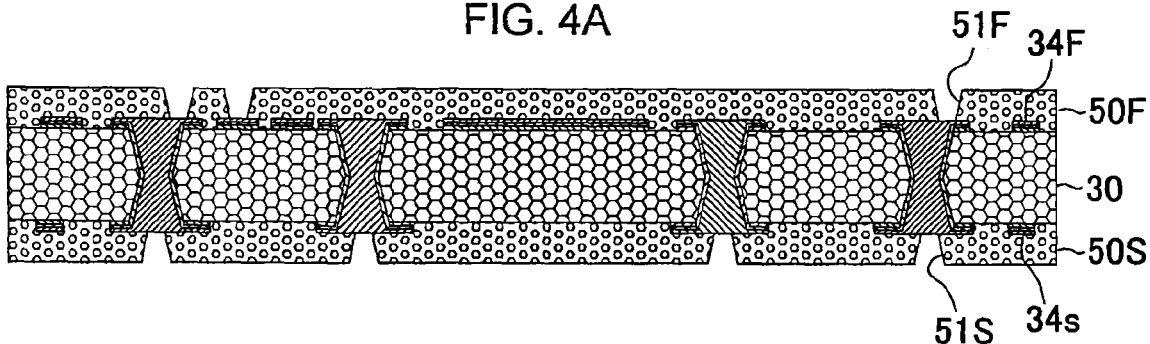
FIG. 4A through 4D are process diagrams illustrating a method of manufacturing the package substrate according to the first embodiment.

(4) Subsequently, conductive via openings (51F, 51S) are each formed on the insulating resin interlayers (50F, 50S) using a $CO_2$ gas laser (FIG. 4A).

Figure 4B:
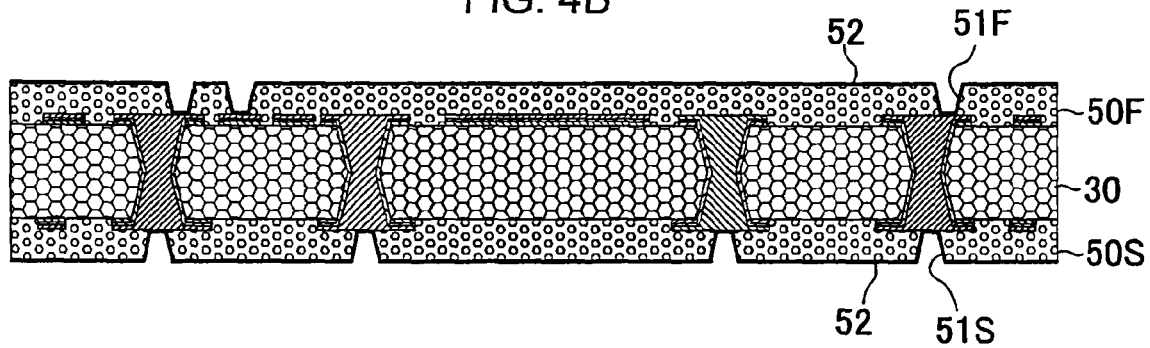

(5) Electroless plating film (52, 52) is formed on the insulating resin interlayers (50F, 50S) and on the inner walls of the openings (51F, 51S) (FIG. 4B).

Figure 4C:
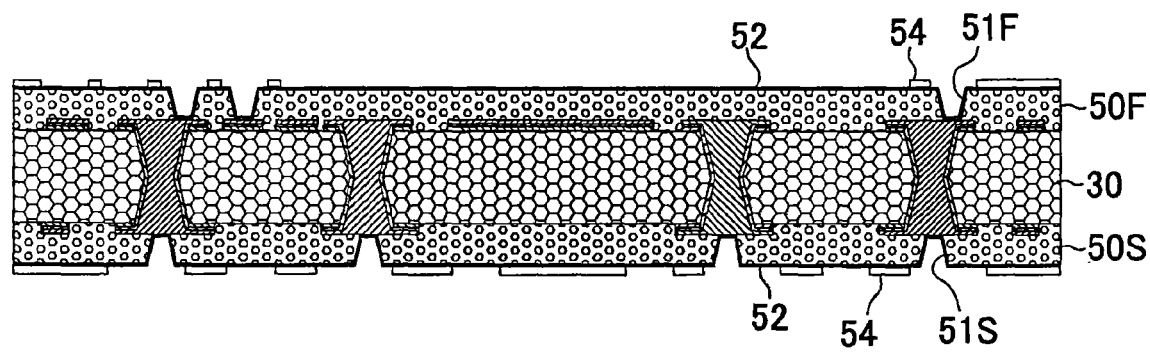

(6) A plating resist 54 is formed on the electroless plating film 52 (FIG. 4C).

Figure 4D:
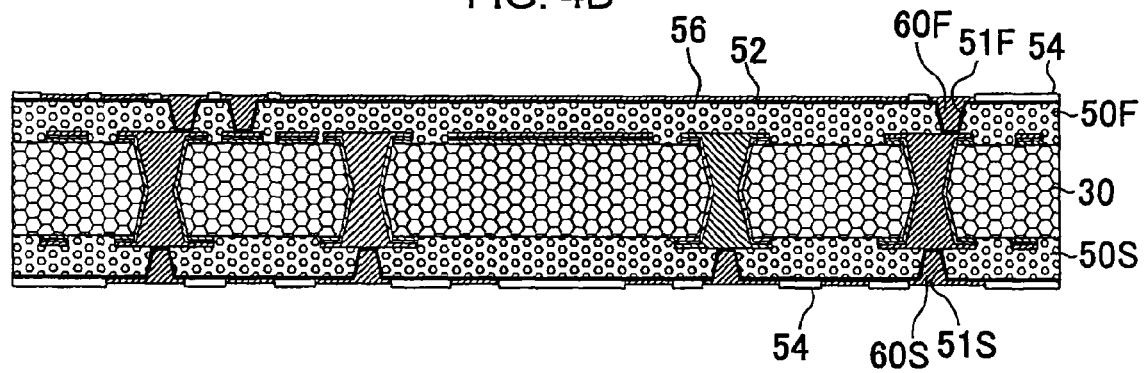

(7) An electroplated copper film 56 is formed on the portions of the electroless plating film 52 exposed through the plating resist 54. At this time, the openings (51F, 51S) are filled with the electroplated film 56. The conductive vias (60F, 60S) are thus formed (FIG. 4D).

(8) The plating resist 54 is removed. The electroless plating film 52 exposed through the electroplated film 56 is also removed. The second conductive layer (58FP) (second conductive layer on the first surface) is formed on the insulating resin interlayer (50F). The second conductive layer (58S) (second conductive layer on the second surface) is formed on the insulating resin interlayer (50S).

(9) A B-stage resin film is prepared. The B-stage resin film includes a first surface and a second surface opposite the first surface. A seed layer 151 is sputtered onto the first surface of the resin film. The seed layer may be formed from copper and the like. The seed layer (sputtered film) is 0.05 μm to 0.3 μm thick. The resin film with the seed layer is laminated onto the first surface of the second conductive layer (58FP) and the first surface of the insulating resin interlayer (50F) such that the second surface of the resin film faces the first surface of the insulating resin interlayer (50F). Subsequently, the resin film is cured, forming the inner insulating resin interlayer (150Fa) (inner insulating resin interlayer on the first surface) on the second conductive layer (58FP) on the first surface, and the insulating resin interlayer (50F) on the first surface. In the embodiment, the inner insulating resin interlayer on the first surface is an insulating resin interlayer with a seed layer.

Figure 5A:
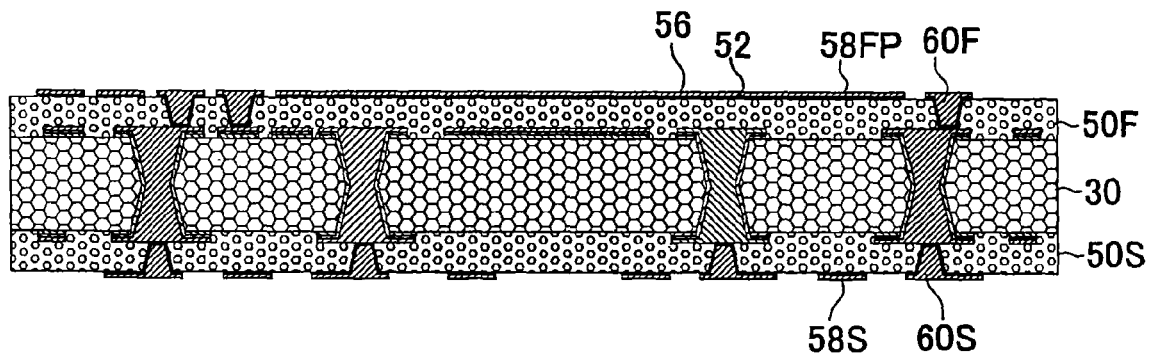
FIG. 5A through 5C are process diagrams illustrating a method of manufacturing the package substrate according to the first embodiment.
Figure 5B:
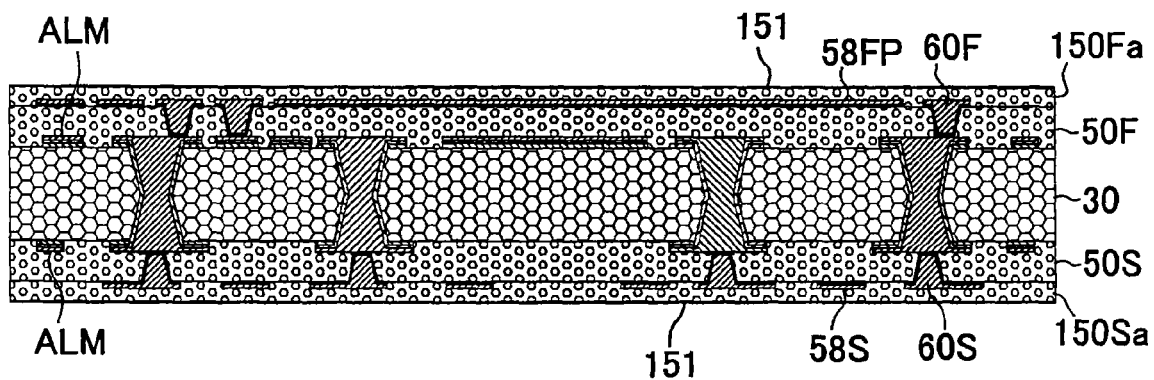

None of the conductive vias in the package substrate according to the first embodiment pass through only the inner insulating resin interlayer. Therefore, the seed layer may be formed on the resin film before laminating the resin film. Further, the seed layer is thin and has a uniform thickness because the seed layer is sputtered on before lamination. However, the seed layer may be formed on the inner insulating resin interlayer after forming the inner resin interlayer. None of the conductive vias in the package substrate according to the first embodiment pass through only the inner insulating resin interlayer. Thus, even if the seed layer is formed after lamination, the seed layer is thin and uniform because there is no need to form the seed layer on the inner walls of the conductive via openings. Similarly, the inner insulating resin interlayer (150S) (inner insulating resin interlayer on the second surface) is formed on the second conductive layer (58S) on the second surface, and the insulating resin interlayer (50S) on the second surface (FIG. 5B). In the embodiment, the inner insulating resin interlayer on the second surface is an insulating resin interlayer with a seed layer. The inner insulating resin interlayer (150Fa, 150S) is roughly one-half the thickness of the insulating resin interlayer (50F), at 17 μm.

Figure 5C:
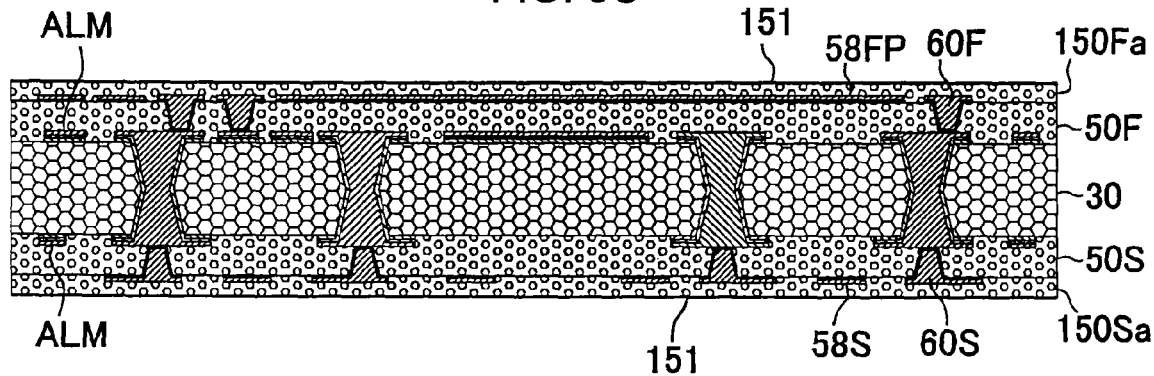
Figure 6A:
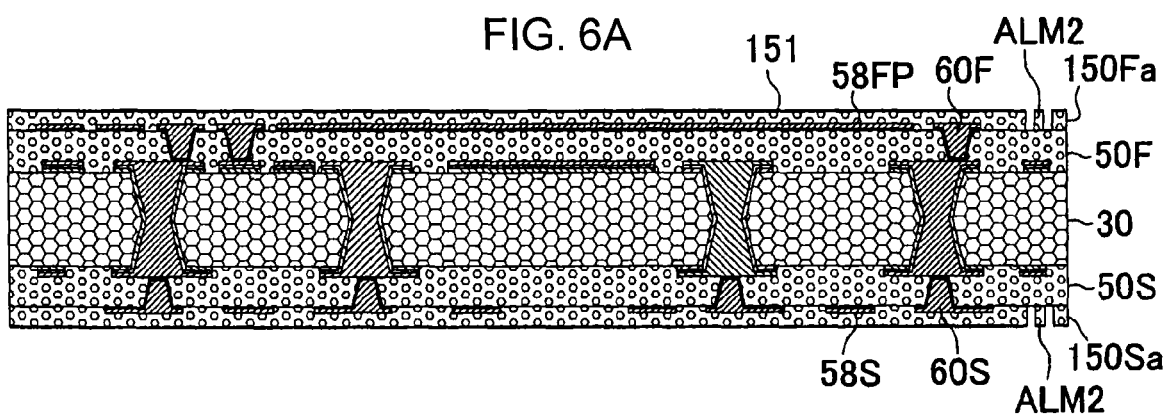
FIGS. 6A and 6B are process diagrams illustrating a method of manufacturing the package substrate according to the first embodiment.
Figure 6B:
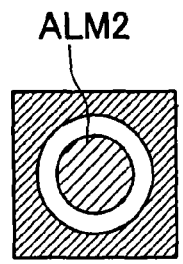

(10) A portion of the seed layer formed on the inner insulating resin interlayer is removed. Hereby, the seed layer on the alignment mark (ALM) formed on the second conductive layer is removed (FIG. 5C). At this time, the seed layer is removed from an area created from an alignment mark (ALM2) (later described). The alignment mark (ALM2) on the inner insulating resin interlayer is formed with the alignment mark on the second conductive layer as a reference (FIG. 6A). FIG. 6B depicts an example of the alignment mark (ALM2). The portions where the slanted lines are drawn represent the upper surface of the inner insulating resin interlayer. The portion with no lines represents a groove. The alignment mark is created from the inner insulating resin interlayer and the groove on the inner insulating resin interlayer. For instance, the alignment mark is a ring-shaped groove cut into the inner resin interlayer with a laser.

Figure 7A:
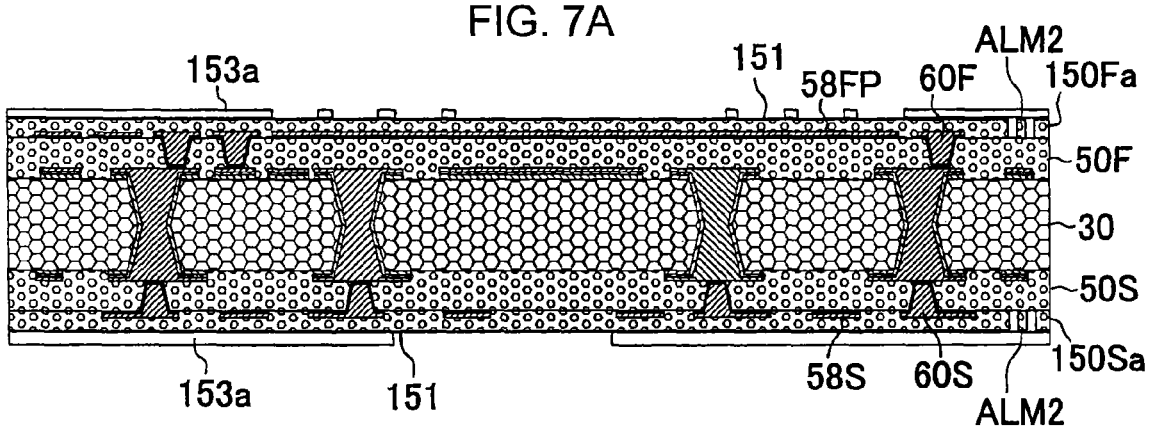
FIG. 7A through 7C are process diagrams illustrating a method of manufacturing the package substrate according to the first embodiment.

(11) A plating resist (153a) is formed on the seed layer 151 with the alignment mark (ALM2) as a reference (FIG. 7A). The plating resist (153a) is formed over the entire inner insulating resin interlayer on the second surface.

Figure 7B:
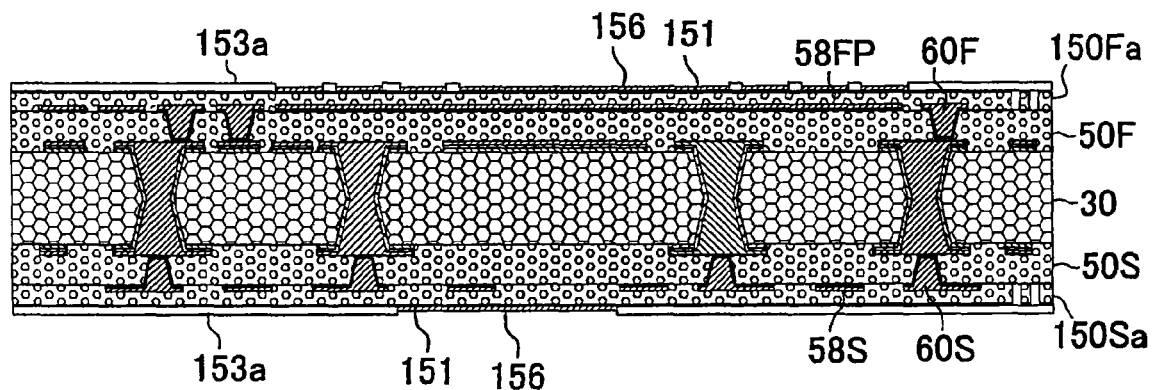

(12) An electroplated copper layer 156 is formed on the portions of the seed layer 151 exposed through the plating resist (153a) (FIG. 7B).

Figure 7C:
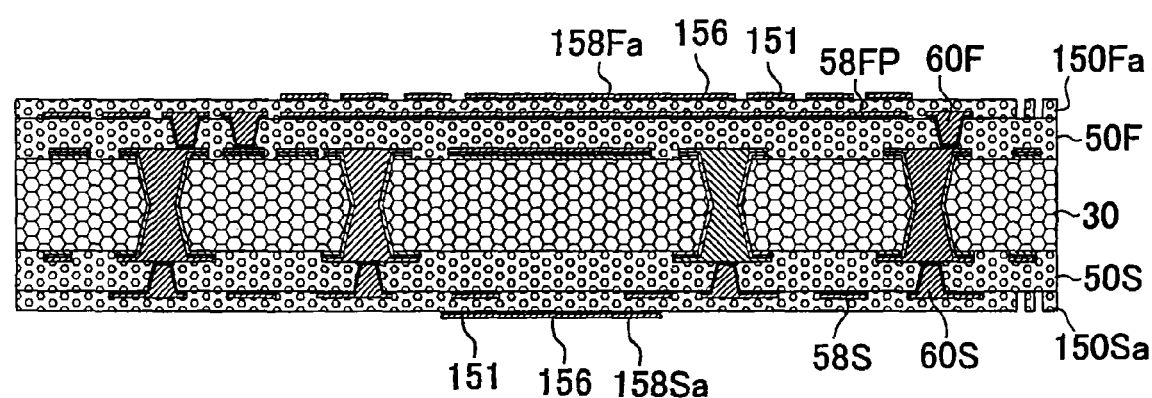
Figure 8A:
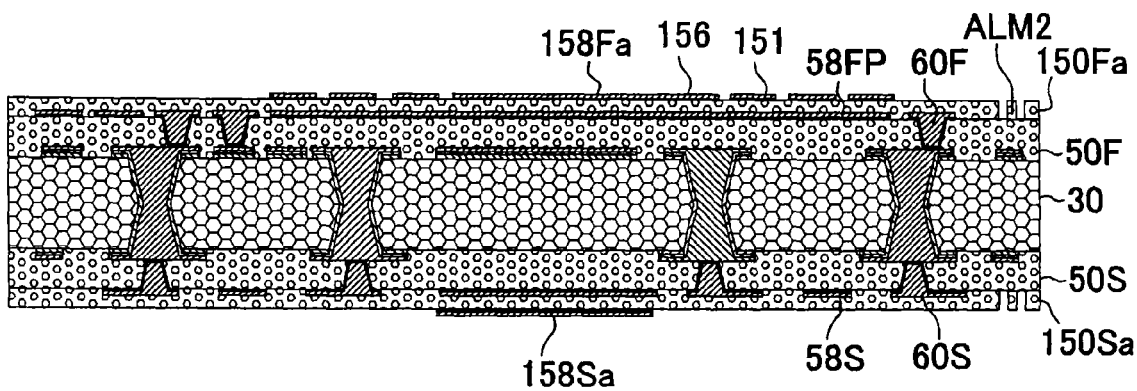
FIG. 8A through 8C are process diagrams illustrating a method of manufacturing the package substrate according to the first embodiment.

(13) The plating resist (153a) is removed (FIG. 7C). The seed layer 151 exposed through the electroplated copper layer 156 is removed. This forms the first conductive layer (158Fa) (first upper conductive layer) on the inner insulating resin interlayer (150Fa) on the first surface made from the seed layer 151 and the electroplated copper layer 156 on the seed layer, and forms the first conductive layer (158Sa) (first lower conductive layer) on the inner insulating resin interlayer (150Sa) on the first surface (FIG. 8A). A portion of the first upper conductive layer (158Fa) is illustrated in FIG. 11, which is a plan view. The line-and-space pattern (L/S) of the first conductive circuit including the first conductive layer is, for example, 5/5 μm. The first conductive via pads (158Fai) and the second conductive via pads (158Fam) are formed simultaneously. The first conductive layer includes these conductive via pads and a first alignment mark that is formed at the same time. The first alignment mark is not illustrated. The first lower conductive layer (158Sa) is used as a grounding layer; even if the first lower conductive layer (158Sa) has the same pattern as the first upper conductive layer (158Fa), there may be at least one plain layer used for grounding. However, the total area of the first lower conductive layer (158Sa) is substantially equivalent to the total area of the first upper conductive layer (158Fa).

Figure 8B:
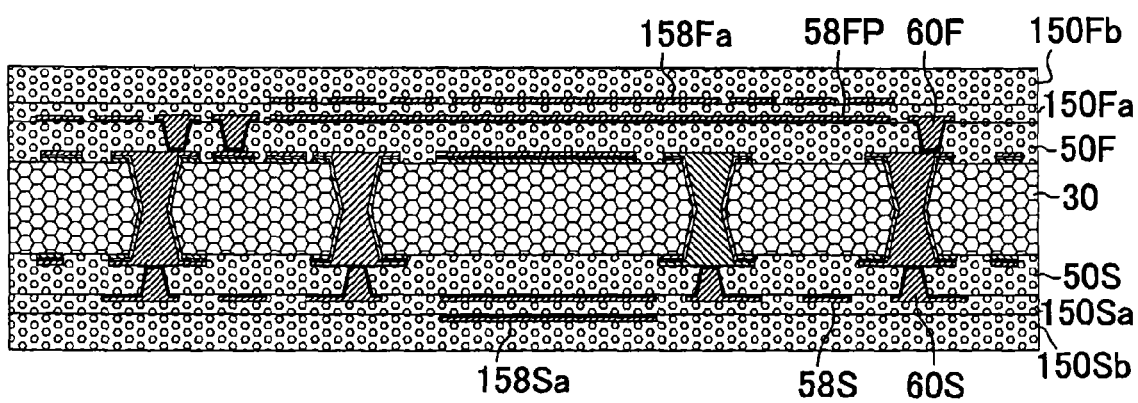

(14) The outermost insulating resin interlayer (150Fb) (uppermost insulating resin interlayer) is formed on the inner insulating resin interlayer and the first upper conductive layer (dedicated interconnect layer) on the first surface. The outermost insulating resin interlayer (150Sb) (lowermost insulating resin interlayer) is formed on the inner insulating resin interlayer on the second surface (FIG. 8B). The insulating resin interlayers (150Fb, 150Sb) have the same thickness as the insulating resin interlayers (50F, 50S).

Figure 8C:
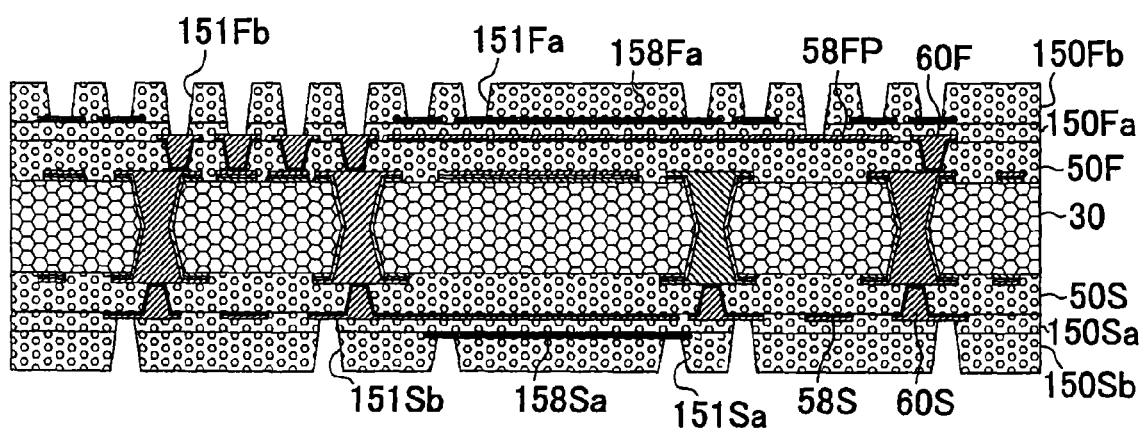

(15) A laser is used to form the first opening (151Fa) and the second opening (151Fb) with the first alignment mark as a reference. The first opening (151Fa) passes through the uppermost insulating resin interlayer (150Fb) up to the first conductive layer (158Fa), and the second opening (151Fb) passes through the uppermost insulating resin interlayer (150Fb) and the inner insulating resin interlayer (150Fa) on the first surface and up to the second conductive layer (58FP) on the first surface. The opening (151Sa) is formed passing through the lowermost insulating resin interlayer (150Sb) up to the first conductive layer (158Sa), and the second opening (151Sb) is formed passing through the lowermost insulating resin interlayer (150Sb) and the inner insulating resin interlayer (150Sa) on the second surface and up to the second conductive layer (58S) on the second surface (FIG. 8C).

(16) A semi-additive process is used to form conductive vias (160Fa, 160Fb, 160Sa, 160Sb) in openings (151Fa, 151Fb, 151Sa, 151Sb) for creating conductive vias. The uppermost conductive layer (158Fb) and the lowermost conductive layer (158Sb) are also formed. The conductive vias (160Fb, 160Sb) are conductive skip vias that pass through both the uppermost insulating resin interlayer and the inner insulating resin interlayer, and connect the uppermost conductive layer and the second conductive layer. The uppermost conductive layer (158Fb) and the second conductive layer (58FP) on the first surface include a plain layer that sandwiches the first conductive circuit. The uppermost conductive layer (158Fb) and the first conductive layer (158Fa) are connected through the conductive via (160Fa). The lowermost conductive layer (158Sb) and the first conductive layer (158Sa) are connected through the conductive via (160Sa). The uppermost conductive layer includes the first pad group and the second pad group. The second pad group includes first through fourth groups, and, as illustrated in FIGS. 10A and 10B, the second pad group surrounds the first pad group. Each of the second pad groups are formed outward of each of the sides of the first pad group.

(17) A solder resist layer (70F) is formed on the first surface including an opening (71F), and a solder resist layer (70S) is formed on the second surface including an opening (71S). The solder resist layer (70F) and the solder resist layer (70S) are formed on the first buildup layer (55F) and the second buildup layer (55S) respectively. The opening (71F) in the first solder resist layer (70F) on the first buildup layer (55F) exposes the upper surface of the first pads (76FP) and the second pads (76SP). Whereas, the upper surface of the conductive layer and the via lands exposed by the opening (71S) in the second solder resist layer (70S) function as the pad (76MP) for connecting a motherboard.

Figure 9A:
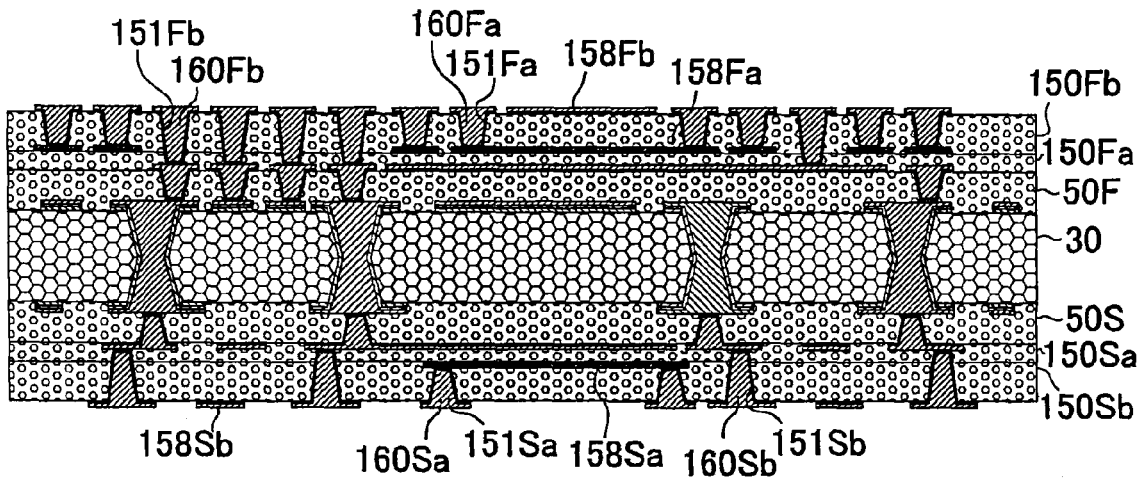
FIG. 9A through 9C are process diagrams illustrating a method of manufacturing the package substrate according to the first embodiment.
Figure 9B:
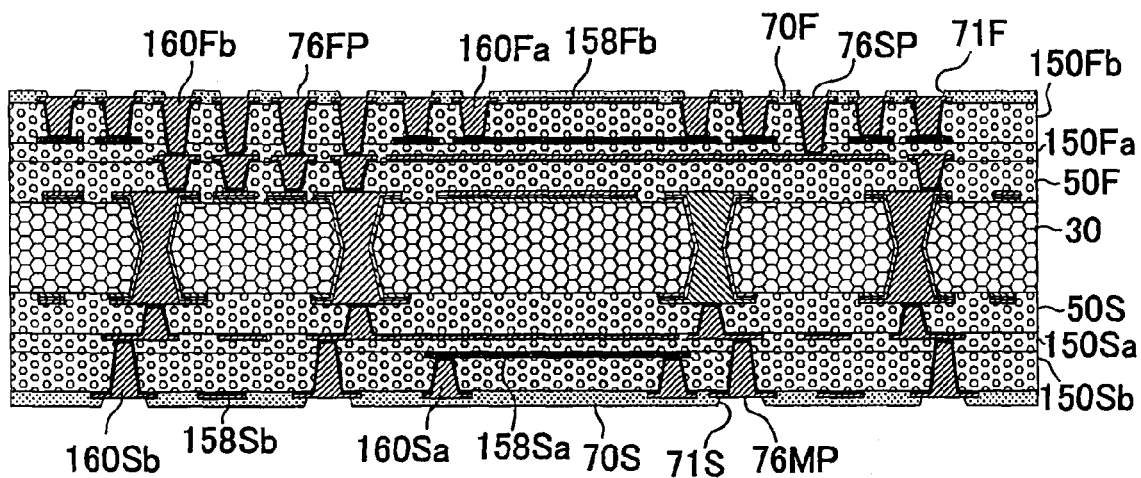
Figure 9C:
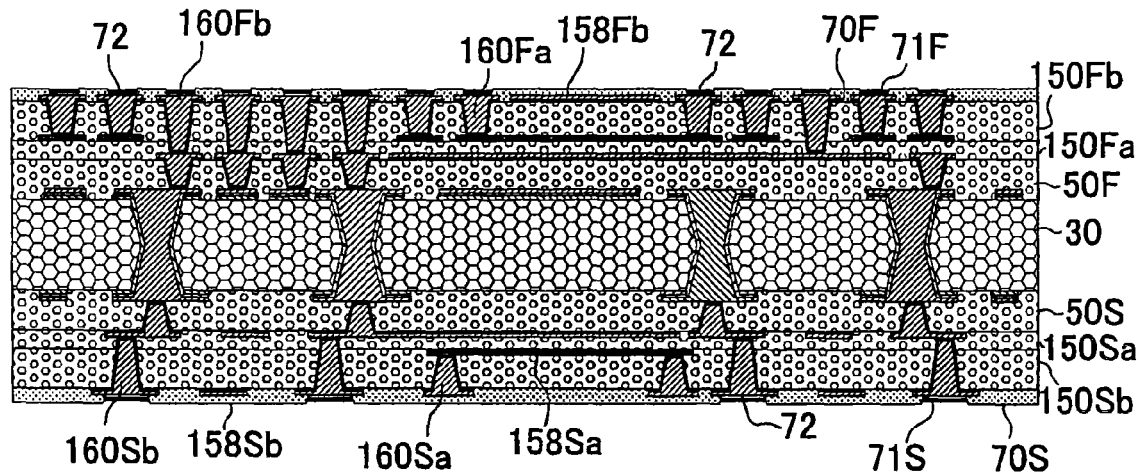

(18) The pads (76FP, 76SP, 76MP) are nickel plated, and the nickel deposited on the pads is further gold plated to form a metallic layer made from nickel plating and gold plating (FIG. 9C). A nickel-palladium metal layer or an OSP film may be formed instead of the nickel-metal layer.

(19) Solder bumps are mounted on the pads (76FP, 76SP, 76MP) and the solder bumps (76FM, 76FL, 76S) formed using a reflow process. The package substrate 10 is hereby complete (FIG. 1).

(20) The IC chip (110L) with a logic system is mounted on the solder bumps (76FL) on the first pads, and the memory (110M) mounted on the solder bumps (76FM) on the second pads (FIG. 2, FIG. 10B). An underfill 114 is then added between the package substrate, and the IC chip (110L), and the memory (110M) (FIG. 2).

First Exemplary Modification of the First Embodiment

Figure 12:
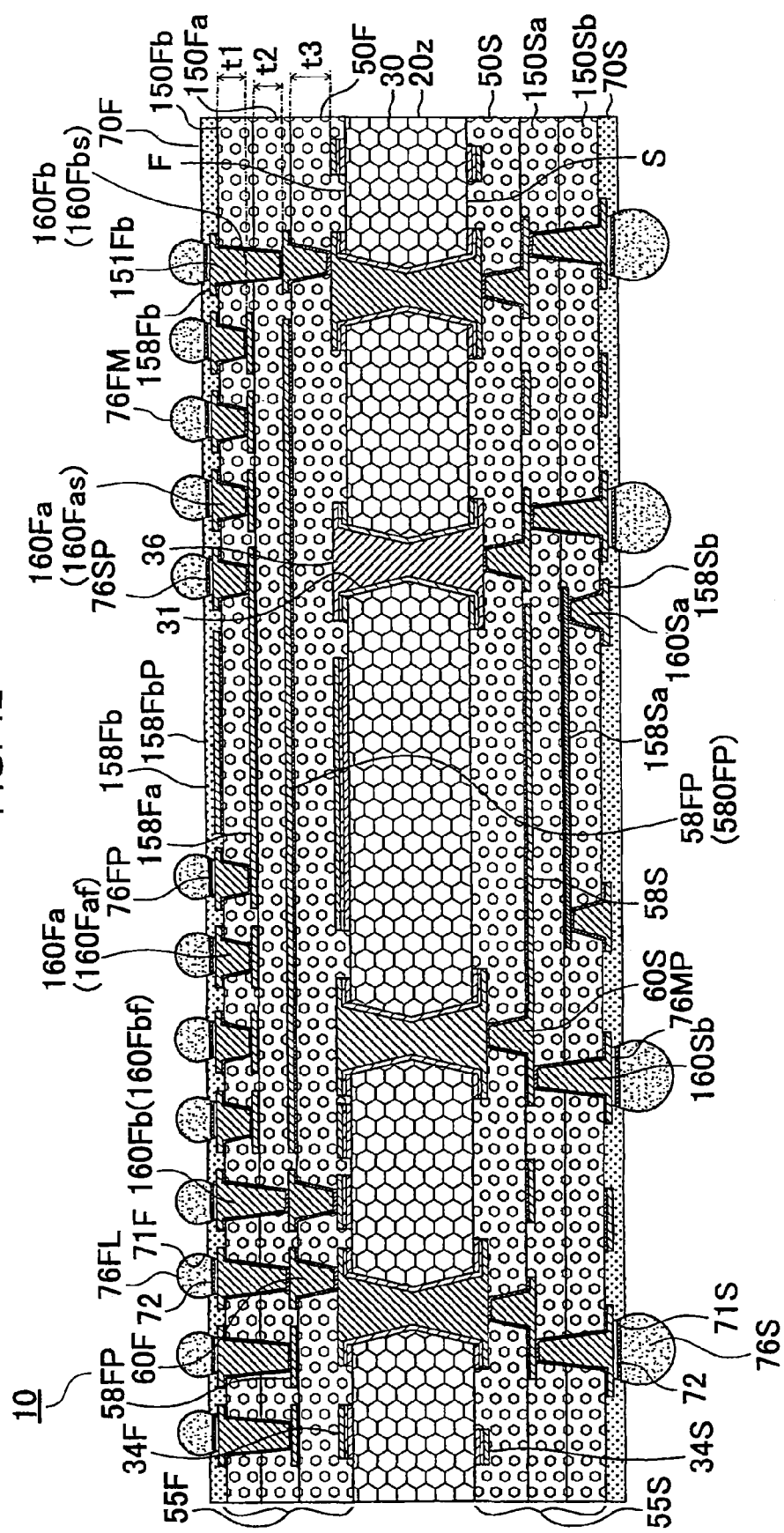
FIG. 12 is a cross-sectional view illustrating a package substrate according to an exemplary modification of the first embodiment according to the invention.

FIG. 12 is a cross-sectional view illustrating a package substrate according to an exemplary modification of the first embodiment according to the invention. In the first embodiment and the first exemplary modification, the thickness (t1) of the uppermost insulating resin interlayer (150Fb) and the thickness (t2) of the upper inner insulating resin interlayer (150Fa) are substantially equivalent. Additionally, the thickness of the lowermost insulating resin interlayer (150Sb), and the thickness of the lower inner insulating resin interlayer (150Sa) are substantially equivalent.

Japanese Unexamined Patent Application Publication No. H06-53349 describes a multi-chip module substrate that includes four interconnect layers, where all four layers include interconnects connecting the two LSI chips. An LSI chip may include a source line and a ground line. The LSI chips described in JP H06-53349 may include source and ground interconnects that are connected to the source and ground lines respectively of the LSI chips. Furthermore, at least one of the four interconnect layers in JP H06-53349 may include an interconnect connecting the two LSI chips, and a shared source interconnect or ground interconnect. Thus, it may be difficult to increase the transmission speed between the electronic components on the multi-chip module substrate described in JP H06-53349.

A package substrate according to an embodiment of the present invention allows for higher signal transmission speeds between the electronic components thereon, and warping tends not to occur.

A package substrate according to an embodiment of the present invention includes: a core substrate provided with an upper part and a lower part; and an uppermost insulating resin interlayer on the upper part of the core substrate including a first surface and a second surface opposite the first surface; an uppermost conductive layer formed on the first surface of the uppermost insulating resin interlayer including a first pad group formed from multiple first pads for mounting a first electronic component, and a second pad group formed from multiple second pads for mounting a second electronic component; a first upper conductive layer formed underneath the second surface of the uppermost insulating resin interlayer including first upper conductive circuits; an upper inner insulating resin interlayer formed underneath the uppermost insulating resin interlayer and the first upper conductive layer; a second upper conductive layer formed underneath the upper inner insulating resin interlayer; a second conductive via penetrating through the uppermost insulating resin interlayer and connecting the first conductive layer and the second pads; an upper conductive skip via penetrating through the uppermost insulating resin interlayer and the upper inner insulating resin interlayer simultaneously, and connecting the uppermost conductive layer and the second upper conductive layer; a lowermost insulating resin interlayer in the lower part of the core substrate including a first surface and a second surface opposite the first surface; a lowermost conductive layer including a third pad group formed on the lowermost insulating resin interlayer on the first surface; a first lower conductive layer formed underneath the second surface of the lowermost insulating resin interlayer including first lower conductive circuits; a lower inner insulating resin interlayer formed underneath the second surface of the lowermost insulating resin interlayer and the first lower conductive layer; a second lower conductive layer formed underneath the lower inner insulating resin interlayer; a third conductive via penetrating through the lowermost insulating resin interlayer and connecting the first lower conductive layer and the third pads; and a lower conductive skip via penetrating through the lowermost insulating resin interlayer and the lower inner insulating resin interlayer simultaneously, and connecting the lowermost conductive layer and the second lower conductive layer.

Obviously, numerous modifications and variations of the present invention are possible in light of the above teachings. It is therefore to be understood that within the scope of the appended claims, the invention may be practiced otherwise than as specifically described herein.

What is claimed is:

1. A package substrate, comprising:
a core substrate;
a first buildup layer formed on a first surface of the core substrate; and
a second buildup layer formed on a second surface of the core substrate on an opposite side with respect to the first surface of the core substrate,
wherein the first buildup layer comprises an uppermost insulating resin interlayer, an upper inner insulating resin interlayer, an uppermost conductive layer formed on the uppermost insulating resin interlayer and including a plurality of first pads positioned to mount a first electronic component and a plurality of second pads positioned to mount a second electronic component, an upper first conductive layer formed on the upper inner insulating resin interlayer, an upper second conductive layer formed on the upper inner insulating resin interlayer on an opposite side with respect to the upper first conductive layer, a plurality of conductive vias formed through the uppermost insulating resin interlayer such that the plurality of conductive vias is connecting the upper first conductive layer and the second pads, and a plurality of conductive skip vias formed through the uppermost insulating resin interlayer and the upper inner insulating resin interlayer such that the plurality of conductive skip vias is connecting the uppermost conductive layer and the upper second conductive layer, and the second buildup layer comprises a lowermost insulating resin interlayer, a lower inner insulating resin interlayer, a lowermost conductive layer formed on the lowermost insulating resin interlayer and including a plurality of third pads, a lower first conductive layer formed on the lower inner insulating resin interlayer, a lower second conductive layer formed on the lower inner insulating resin interlayer on an opposite side with respect to the lower first conductive layer, a plurality of conductive vias formed through the lowermost insulating resin interlayer such that the plurality of conductive vias is connecting the lower first conductive layer and the third pads, and a plurality of conductive skip vias formed through the lowermost insulating resin interlayer and the lower inner insulating resin interlayer such that the plurality of conductive skip vias is connecting the lowermost conductive layer and the lower second conductive layer.

2. A package substrate according to claim 1, wherein the upper and lower first conductive layers are formed such that the upper and lower first conductive layers have substantially a same area.

3. A package substrate according to claim 1, wherein the upper and lower first conductive layers are formed such that the lower first conductive layer is positioned to correspond with the upper first conductive layer.

4. A package substrate according to claim 1, wherein the lower first conductive layer is a plane conductive layer forming a grounding layer.

5. A package substrate according to claim 1, wherein the upper first conductive layer includes a plurality of conductive circuits such that each of the conductive circuits is connecting one of the first pads and one of the second pads.

6. A package substrate according to claim 1, wherein the upper first conductive layer is consisting of a plurality of dedicated conductive circuits configured to transmit data between the first electronic component and the second electronic component.

7. A package substrate according to claim 1, wherein the upper inner insulating resin interlayer does not have a via conductor formed only in the upper inner insulating resin interlayer.

8. A package substrate according to claim 1, wherein the uppermost insulating resin interlayer has a thickness which is substantially equal to a thickness of the upper inner insulating resin interlayer.

9. A package substrate according to claim 1, wherein the lowermost insulating resin interlayer has a thickness which is substantially equal to a thickness of the lower inner insulating resin interlayer.

10. A package substrate according to claim 1, wherein the uppermost insulating resin interlayer has a thickness which is twice or greater than twice a thickness of the upper inner insulating resin interlayer.

11. A package substrate according to claim 1, wherein the upper first conductive layer includes a plurality of conductive circuits, and the uppermost conductive layer, the plurality of conductive circuits of the upper first conductive layer, and the upper second conductive layer form a stripline structure.

12. A package substrate according to claim 1, wherein the first electronic component is a logic IC component, and the second electronic component is a memory component.

13. A package substrate according to claim 1, wherein the uppermost conductive layer, the upper first conductive layer and the upper second conductive layer form a stripline structure.

14. A package substrate according to claim 2, wherein the upper and lower first conductive layers are formed such that the lower first conductive layer is positioned to correspond with the upper first conductive layer.

15. A package substrate according to claim 2, wherein the lower first conductive layer is a plane conductive layer forming a grounding layer.

16. A package substrate according to claim 2, wherein the upper first conductive layer includes a plurality of conductive circuits such that each of the conductive circuits is connecting one of the first pads and one of the second pads.

17. A package substrate according to claim 2, wherein the upper first conductive layer is consisting of a plurality of dedicated conductive circuits configured to transmit data between the first electronic component and the second electronic component.

18. A package substrate according to claim 1, wherein the upper first conductive layer is consisting of a plurality of dedicated conductive circuits configured to transmit data between the first electronic component and the second electronic component, and the uppermost conductive layer, the plurality of conductive circuits of the upper first conductive layer, and the upper second conductive layer form a stripline structure.

19. A package substrate according to claim 1, wherein the uppermost insulating resin interlayer has a thickness which is substantially equal to a thickness of the upper inner insulating resin interlayer, and the lowermost insulating resin interlayer has a thickness which is substantially equal to a thickness of the lower inner insulating resin interlayer.

20. A package substrate according to claim 1, wherein the upper first conductive layer includes a plurality of conductive circuits configured to transmit data between the first electronic component and the second electronic component, the uppermost conductive layer, the plurality of conductive circuits of the upper first conductive layer, and the upper second conductive layer form a stripline structure, the first electronic component is a logic IC component, and the second electronic component is a memory component.

* * * * *